United States Patent
Heinz et al.

(10) Patent No.: US 6,507,140 B1
(45) Date of Patent: Jan. 14, 2003

(54) PIEZOELECTRIC ACTUATOR WITH AN OUTER ELECTRODE THAT IS ADAPTED FOR THERMAL EXPANSION

(75) Inventors: Rudolf Heinz, Renningen (DE); Alexander Hedrich, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/763,257

(22) PCT Filed: Jun. 19, 2000

(86) PCT No.: PCT/DE00/01930

§ 371 (c)(1),
(2), (4) Date: Apr. 18, 2001

(87) PCT Pub. No.: WO00/79608

PCT Pub. Date: Dec. 28, 2000

(30) Foreign Application Priority Data

Jun. 19, 1999 (DE) .......................... 199 28 190

(51) Int. Cl.$^7$ .................. H01L 41/04; H01L 41/08; H01L 41/18; H02N 2/00
(52) U.S. Cl. ................ 310/366; 310/365; 310/364; 310/363
(58) Field of Search ................ 310/366, 346, 310/365, 328, 364

(56) References Cited

U.S. PATENT DOCUMENTS

| | | | | |
|---|---|---|---|---|
| 4,523,121 A | * | 6/1985 | Takahashi et al. | 310/334 |
| 4,871,938 A | * | 10/1989 | Elings et al. | 310/328 |
| 5,199,004 A | * | 3/1993 | Monahan | 367/157 |
| 5,325,012 A | * | 6/1994 | Sata et al. | 310/364 |
| 5,406,164 A | * | 4/1995 | Okawa et al. | 310/328 |
| 5,469,012 A | * | 11/1995 | Suzuki et al. | 310/324 |
| 5,478,978 A | * | 12/1995 | Taylor et al. | 200/233 |
| 5,532,542 A | * | 7/1996 | Yoshida et al. | 310/348 |
| 5,548,178 A | * | 8/1996 | Eda et al. | 310/349 |
| 5,925,973 A | * | 7/1999 | Eda et al. | 310/348 |
| 6,028,390 A | * | 2/2000 | Ogawa et al. | 310/348 |
| 6,215,230 B1 | * | 4/2001 | Ide et al. | 310/366 |

FOREIGN PATENT DOCUMENTS

| | | | |
|---|---|---|---|
| DE | 196 46 676 C1 | | 4/1998 |
| DE | 196 50 900 A1 | | 6/1998 |
| DE | 197 53 930 A | | 6/1999 |
| DE | WO9938220 A1 | * | 7/1999 |
| EP | 0 844 678 A1 | | 5/1998 |
| JP | 403007076 | * | 1/1991 |
| JP | 2001037262 A | * | 2/2001 |

* cited by examiner

Primary Examiner—Nestor Ramirez
Assistant Examiner—Jolio Gonzalez Ramirez
(74) Attorney, Agent, or Firm—Michael J. Striker

(57) ABSTRACT

A piezoelectric actuator, for example for actuating a mechanical component, is proposed, which has a multilayered structure of piezoelectric layers and internal electrodes (2, 3) disposed between them. As a conductive surface, a first external electrode (6) is affixed to a respective side surface and is contacted by the respective internal electrodes (2, 3), and a second net-like or woven cloth-like external electrode (7) is disposed on the first external electrode (6). In the regions of the piezoelectric layers, which have respective internal electrodes (2, 3) that are respectively contacted on opposite sides from one another, there is a passive zone (10) without an internal electrode layer. The ceramic piezoelectric material—at least in the passive zone (10)—and the material of the second external electrode (7) have almost the same thermal expansion coefficient, by means of which the influence of mechanical stresses in the piezoelectric actuator can be reduced.

4 Claims, 1 Drawing Sheet

PIEZOELECTRIC ACTUATOR WITH AN OUTER ELECTRODE THAT IS ADAPTED FOR THERMAL EXPANSION

PRIOR ART

The invention relates to a piezoelectric actuator, for example for actuating a mechanical component such as a valve or the like, according to the features contained in the preamble to the main claim.

It is generally known that using the so-called piezoelectric effect, a piezoelectric element can be constructed out of a material with a suitable crystalline structure. The application of an external electrical voltage causes a mechanical reaction of the piezoelectric element which, depending on the crystalline structure and the region to which the electrical voltage is applied, produces a compression or tension in a predictable direction. This piezoelectric actuator can be constructed of a number of layers (multilayered actuators), wherein the electrodes via which the electrical voltage is applied are respectively disposed between the layers.

Piezoelectric actuators of this kind can be provided, for example, to drive on-off valves in fuel injection systems in motor vehicles. During operation of the piezoelectric actuator here, particular care must be taken that mechanical stresses in the layer structure do not also cause undesirable fractures to form in the vicinity of the external connecting electrodes. Since the internal electrodes, which are each contacted on one side, are integrated into the layer structure in comb fashion, the electrodes disposed one after another in the direction of the layer structure must be respectively contacted in an alternating fashion on opposite sides from one another. When the piezoelectric actuator is actuated, i.e. when a voltage is applied between the internal electrodes on opposite sides in the layer structure, different mechanical forces are produced in the vicinity of the internal electrodes as well as in the vicinity of the contacts on the external electrodes, which can lead to mechanical stresses and therefore to fractures in the external electrodes.

ADVANTAGES OF THE INVENTION

The piezoelectric actuator described at the beginning, which can be used, for example, to actuate a mechanical component, is advantageously modified by virtue of the fact that with a multilayered structure of ceramic piezoelectric layers with internal electrodes disposed between them, as a first external electrode, a conductive surface is affixed to a respective side surface and is contacted by the respective internal electrodes, and a second net-like, woven cloth like, or wavy external electrode is disposed on the first. The second external electrode is contacted at least at points by the first external electrode and expandable regions are disposed between the contacts.

In the regions between two piezoelectric layers, which have a respective internal electrode that is respectively contacted on the opposite sides from the other, there is a passive zone without an internal electrode layer, wherein according to the invention, the ceramic piezoelectric material—at least in the passive zone —and the material of the second external electrode have virtually equal thermal expansion coefficients.

The first external electrode can be a thin layer, for example a few μm thick, made of Ni, Ni+Cu, or Ni+PbSn, which adheres directly to the surface of the piezoelectric actuator; the second external electrode here is disposed so as to protect against lateral fractures which can interrupt the current conduction in the external electrode. The lateral fractures can occur in the first external electrode due to delamination in the internal electrodes as a result of tensile stresses in the piezoelectric layers in the passive zone. Through the disposition of the net-like second external electrode, the lateral fractures are stopped and the current conduction, which may have been interrupted in the first external electrode, is bridged.

In addition, when there are rapid temperature changes, for example from −40° C. to +160° C. in the piezoelectric actuator, there is also the possibility of separation of the first external electrode from the piezoelectric ceramic due to excessive shearing stresses when there is too great a difference between the thermal expansion coefficients of the piezoelectric ceramic material and the material of the external electrodes. In particular, due to its greater thickness (approx. 100 μm), the second external electrode would then exert high shearing forces in comparison to the first layer (approx 5 μm thick).

In a particularly advantageous manner, the mechanical stresses in the piezoelectric actuator can be reduced if the ceramic piezoelectric layers and the second external electrodes have virtually equal thermal expansion coefficients of approx. $1*10^{-6}*1/K$ to $10*10^{-6}*1/K$. The ceramic piezoelectric layers can be made of lead zirconate titanate and the second external electrodes can be made of iron-nickel alloys, e.g. Invar. In order to improve ability of this material to be soldered, it can first be coated with a thin (e.g. 5–10 μm) layer of copper. A Sn-Pb solder layer can then be deposited in order to solder the second external electrode onto the first.

These and other features of preferred modifications of the invention ensue not only from the claims but also from the specification and the drawings, wherein the individual features can be respectively realized singly or multiply in the form of sub-combinations in the embodiment of the invention and in other areas and can represent advantageous and intrinsically patentable embodiments which are claimed herein.

DRAWINGS

An exemplary embodiment of the piezoelectric actuator according to the invention will be explained in conjunction with the drawings.

DESCRIPTION OF THE EXEMPLARY EMBODIMENTS

Figure 1:
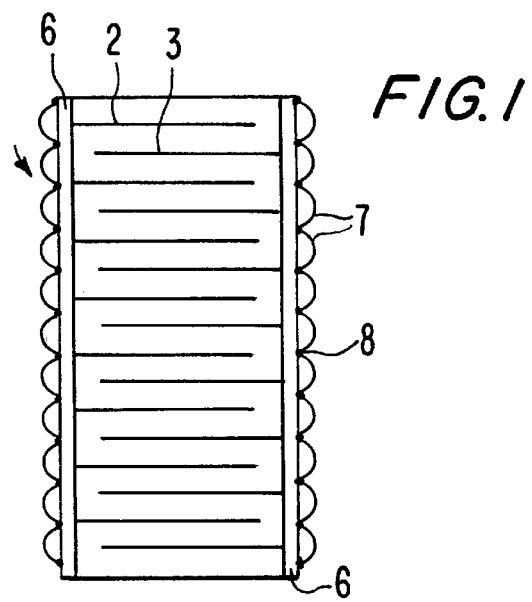
FIG. 1 is a section through a piezoelectric actuator that has a multilayered structure of internal electrodes and piezoelectric ceramic layers and has a net-like external electrode deposited on a first flat external electrode.
Figure 2:
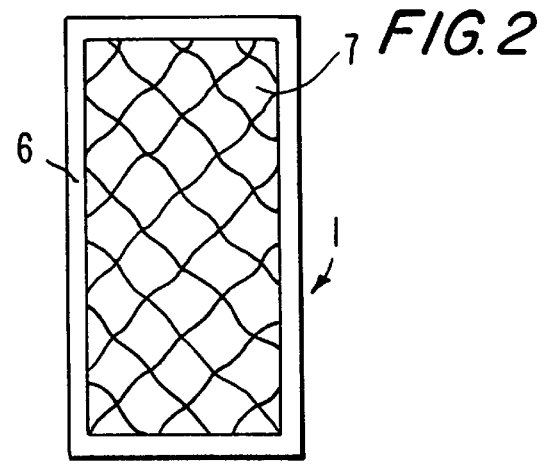
FIG. 2 is a top view of the net-like external electrode according to FIG. 1.

FIG. 1 shows a piezoelectric actuator 1 which is comprised in an intrinsically known manner of piezoelectric foils of a ceramic material with a suitable crystalline structure so that that using the so-called piezoelectric effect, the application of an external electrical voltage to internal electrodes 2 and 3 causes a mechanical reaction of the piezoelectric actuator 1. FIG. 2 shows a side view of this device.

The internal electrodes 2 and 3 are contacted by a first, flat external electrode 6 which is in turn contacted by a second net-like external electrode 7 by means of point contacts 8, for example by means of solders or welds. The first external electrode 6 can be a thin layer, for example a few μm thick, made of Ni, Ni+Cu, or Ni+PbSn, which adheres directly to the surface of the piezoelectric actuator.

Figure 3:
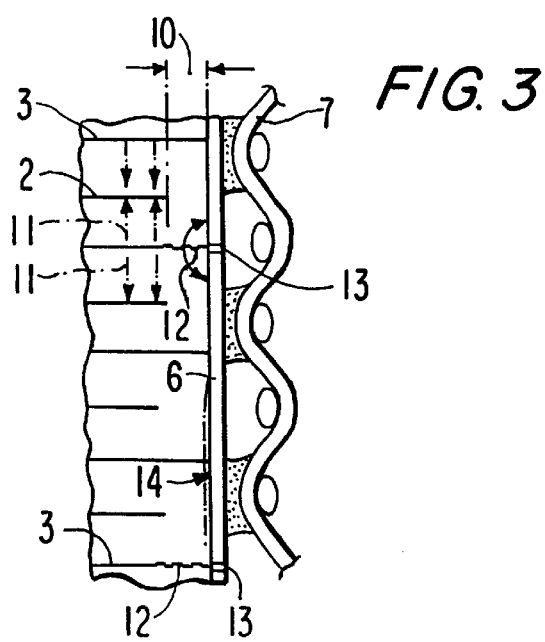
FIG. 3 is a detailed section through the layer structure and the external electrodes in passive zones of the piezoelectric layers, with the fractures that are produced there due to mechanical shearing stresses and lateral stresses that occur.

The detailed sectional view according to FIG. 3 clearly shows the layer structure and the laterally adjoining external electrodes 6 and 7 according to FIGS. 1 and 2. A passive zone 10 is indicated here in which the electrical field according to the arrows 11 is not sharply pronounced, as a result of which the expansion of the piezoelectric actuator 1 does not occur freely, but is forced by means of tensile stress in the ceramic material of the piezoelectric actuator 1. As a result, delaminations 12 can occur, which are indicated here at several electrodes 3. The delamination 12 can turn into a fracture 13 in the first external electrode 6. The fracture 13, however, is stopped by the net-like second external electrode 7 and is conductively bridged.

Furthermore, shearing fractures 14 are indicated in FIG. 3, which can occur between the ceramic material of the piezoelectric layers and the first external electrode 6 due to differing thermal expansion of the piezoelectric ceramic and the second external electrode 7. The relatively thin first external electrode 6 does not have any great influence here.

What is claimed is:

1. A piezoelectric actuator, comprising:

a multilayered structure of ceramic piezoelectric layers with internal electrodes (2, 3) disposed between said layers;

external electrodes (6, 7), said external electrodes arranged to alternatingly and laterally contact said internal electrodes (2, 3), wherein said external electrodes supply an external voltage, wherein a first external electrode (6) is a conductive surface affixed to a side surface of said multilayered structure and is contacted by a respective one of said internal electrodes (2, 3), and wherein a second external electrode (7) comprises a net-like, woven cloth-like, material, said second external electrode disposed on the first external electrode (6), wherein the second external electrode is contacted at least at contact points by the first external electrode (6), wherein expandable regions are disposed between the contact points; and at least one passive zone (10) in said multilayered structure having no internal electrode, and wherein the ceramic piezoelectric layers—at least in the at least one passive zone (10)—and the material of the second external electrode (7) have almost the same thermal expansion coefficient as one another.

2. The piezoelectric actuator according to claim 1, wherein the ceramic piezoelectric layers and the material of the second external electrode (7) each have a thermal expansion coefficient of approximately $1*10^{-6}*1/K$ to $10*10^{-6}*1/K$.

3. The piezoelectric actuator according to claim 2, wherein the ceramic piezoelectric layers are made of lead zirconate titanate.

4. The piezoelectric actuator according to claim 2 or 3, wherein the second external electrode (7) is made of an iron-nickel alloy.

* * * * *